United States Patent
Usatyuk et al.

(10) Patent No.: US 10,931,310 B2
(45) Date of Patent: Feb. 23, 2021

(54) METHOD AND APPARATUS FOR ENCODING AND DECODING OF VARIABLE LENGTH QUASI-CYCLIC LOW-DENSITY PARITY-CHECK, QC-LDPC, CODES

(71) Applicant: HUAWEI TECHNOLOGIES CO., LTD., Shenzhen (CN)

(72) Inventors: Vasily Stanislavovich Usatyuk, Moscow (RU); Ilya Viktorovich Vorobyev, Moscow (RU); Nikita Andreevich Polianskii, Moscow (RU); German Viktorovich Svistunov, Moscow (RU)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/411,268

(22) Filed: May 14, 2019

(65) Prior Publication Data
US 2019/0268021 A1 Aug. 29, 2019

Related U.S. Application Data

(63) Continuation of application No. PCT/RU2016/000777, filed on Nov. 14, 2016.

(51) Int. Cl.
  *H03M 13/11* (2006.01)
  *H03M 13/00* (2006.01)
  *H03M 13/03* (2006.01)

(52) U.S. Cl.
  CPC ....... *H03M 13/116* (2013.01); *H03M 13/036* (2013.01); *H03M 13/1117* (2013.01);
  (Continued)

(58) Field of Classification Search
  CPC .................................................. H03M 13/116
  See application file for complete search history.

(56) References Cited

U.S. PATENT DOCUMENTS 8,266,512 B2  9/2012 Park et al.
8,433,984 B2 * 4/2013 Khandekar ....... H03M 13/6516
                                                       714/751

(Continued)

FOREIGN PATENT DOCUMENTS

CN    101432968 A    5/2009
CN    101854228 A    10/2010
CN    103795424 A    5/2014

OTHER PUBLICATIONS

V. Usatyuk and S. Egorov, "Generalization of floor lifting for QC-LDPC codes," 2017 IEEE East-West Design & Test Symposium (EWDTS), Novi Sad, 2017, pp. 1-6.*

(Continued)

*Primary Examiner* — Steve N Nguyen
(74) *Attorney, Agent, or Firm* — Westerman, Hattori, Daniels & Adrian, LLP (57) ABSTRACT

A method for quasi-cyclic low-density parity-check (QC-LDPC) encoding and decoding of a data packet by a lifted matrix is provided, the method comprising: lifting the QC-LDPC code for maximal code length $N_{max}$ and maximal circulant size $Z_{upper}$ of the base matrix; generating a plurality of optimal values $r_i$ for a plurality of circulants $Z_1$, $Z_2$, ..., $Z_{upper}$ based on the QC-LDPC code lifted for maximal length $N_{max}$, $0 \leq r_i \leq Z_{upper}-1$; saving the generated plurality of optimal values $r_i$ corresponding to the plurality of circulants $Z_1$, $Z_2$, ..., $Z_{upper}$ and a matrix for the QC-LDPC code lifted for maximal length $N_{max}$ in the memory; receiving a current circulant $Z_{current}$ from the plurality of circulants $Z_1$, $Z_2$, ..., $Z_{upper}$; selecting a current optimal value $r_{current}$ from the plurality of optimal values $r_i$ stored in the memory corresponding to the current circulant $Z_{current}$; and lifting the base matrix based on the current optimal value $r_{current}$.

9 Claims, 9 Drawing Sheets

(52) U.S. Cl.
CPC .... *H03M 13/1182* (2013.01); *H03M 13/1188* (2013.01); *H03M 13/635* (2013.01); *H03M 13/6516* (2013.01)

(56) References Cited

U.S. PATENT DOCUMENTS

| | | | |
|---|---|---|---|
| 8,578,249 B2 | 11/2013 | Khandekar et al. | |
| 9,100,052 B2 | 8/2015 | Pisek | |
| 2008/0008270 A1 | 1/2008 | Li et al. | |
| 2008/0178065 A1 | 7/2008 | Khandekar et al. | |
| 2009/0049357 A1 | 2/2009 | Ueng et al. | |
| 2010/0257425 A1 | 10/2010 | Yue et al. | |
| 2013/0086455 A1 | 4/2013 | Pisek | |
| 2017/0134050 A1* | 5/2017 | Abu-Surra | H03M 13/116 |
| 2017/0149528 A1* | 5/2017 | Kim | H03M 13/25 |

OTHER PUBLICATIONS

Seho Myung and Kyeongcheol Yang, "Extension of quasi-cyclic LDPC codes by lifting," Proceedings. International Symposium on Information Theory, 2005. ISIT 2005., Adelaide, SA, 2005, pp. 2305-2309.*
Seho Myung, Kyeongcheol Yang and Youngkyun Kim, "Lifting methods for quasi-cyclic LDPC codes," in IEEE Communications Letters, vol. 10, No. 6, pp. 489-491, Jun. 2006.*
A. Tasdighi, A. H. Banihashemi and M. Sadeghi, "Efficient Search of Girth-Optimal QC-LDPC Codes," in IEEE Transactions on Information Theory, vol. 62, No. 4, pp. 1552-1564, Apr. 2016.*
Seho Myung et al.,"Lifting Methods for Quasi-Cyclic LDPC Codes",IEEE Communications Letters, vol. 10, No. 6, Jun. 2006,total 3 pages.
IEEE Standard C802.16e-05/066r3 Brian Classon et al.,"LDPC Coding for OFDMA PHY",dated Jan. 27, 2005,total 16 pages.
Ming Jiang et al.,"An improved variable length coding scheme using structured LDPC codes",2010 International Conference on Wireless Communications and Signal Processing (WCSP),total 5 pages.
[1] R. Gallager, "Low density parity-check codes,"IRE Trans, Information Theory, pp. 21-18.Jan. 1962.
[2] R. M. Tanner, "A recursive approach to low complexity codes," IEEE Trans. Information Theory, pp. 533-547, Sep. 1981.
[3] D. Mackay and R. Neal, "Good codes based on very sparse matrices," Cryptography and Coding, 5th IMA Conf., C. Boyd, Ed., Lecture Notes in Computer Science, pp. 99-111, Berlin, Germany, 1995.
[4] D. Mackay, "Good error correcting codes based on very sparse matrices," IEEE Trans. Information Theory, pp. 399-431, Mar. 1999.
[5] N. Alon and M. Luby, "A linear time erasure-resilient code with nearly optimal recovery," in IEEE Transactions on Information Theory, vol. 42, No. 6, pp. 1732-1736, Nov. 1996.
[6] T. Richardson, M. Shokrollahi, and R. Urbanke, "Design of capacity approaching irregular low-density parity-check codes," IEEE Trans. Inform. Theory, vol. 47, No. 2, pp. 619-637, Feb. 2001.
[7] Sae-Young Chung; Forney, G.D., Jr.; Richardson, T.J.; Urbanke, R., "On the design of low-density parity-check codes within 0.0045 dB of the Shannon limit," Communications Letters, IEEE , vol. 5, No. 2, pp. 58-60, Feb. 2001.
[9] Kasai, K.; Sakaniwa, K., "Spatially-coupled MacKay-Neal codes and Hsu-Anastasopoulos codes," Information Theory Proceedings (ISIT), 2011 IEEE International Symposium on , vol., No., pp. 747-751, Jul. 31, 2011-Aug. 5, 2011.
[10] Sugihara, K.; Miyata, Y.; Sugihara, T.; Kubo, K.; Yoshida, H.; Matsumoto, W.; Mizuochi, T., "A spatially-coupled type LDPC Code with an NCG of 12 dB for optical transmission beyond 100 Gb/s," Optical Fiber Communication Conference and Exposition and the National Fiber Optic Engineers Conference (OFC/NFOEC), 2013 , vol., No., pp. 1-3, Mar. 2013.

[11] Maunder, R.G., "A Fully-Parallel Turbo Decoding Algorithm," in Communications, IEEE Transactions on , vol. 63, No. 8, pp. 2762-2775, Aug. 2015.
[12] Niclas Wiberg ,"Codes and Decoding on General Graphs" Volym 440 Linköping studies in science and technology: Dissertations, Linköping University, 1996 ,total 108 pages.
[13] Tanner, R.M.; Sridhara, D.; Sridharan, A.; Fuja, T.E.; Costello, D.J., "LDPC block and convolutional codes based on circulant matrices," in Information Theory, IEEE Transactions on , vol. 50, No. 12, pp. 2966-2984, Dec. 2004.
[14] Beermann, M.; Wickert, F.; Vary, P., "Highly flexible design of multi-rate multi-length quasi-cyclic LDPC codes," in Turbo Codes and Iterative Information Processing (ISTC), 2014 8th International Symposium on , vol., No., pp. 37-41.
[15] Seho Myung; Kyeongcheol Yang, "Extension of quasi-cyclic LDPC codes by lifting," in Information Theory, 2005. ISIT 2005. Proceedings. International Symposium on, vol., No., pp. 1-5, Sep. 4-9, 2005.
[17] Ming Jiang; Chen Wang; Yuan Zhang; Chunming Zhao, "An improved variable length coding scheme using structured LDPC codes," in Wireless Communications and Signal Processing (WCSP), 2010 International Conference on , vol., No., pp. 1-5, Oct. 21-23, 2010.
[18] Jin Xu; Jun Xu, "Structured LDPC Applied in IMT-Advanced System," in Wireless Communications, Networking and Mobile Computing, 2008. WiCOM 08. 4th International Conference on , vol., No., pp. 1-4.
[20] Jeongseok Ha, Jaehong Kim, Demijan Klinc, and Steven W. McLaughlin ,"Rate-Compatible Punctured Low-Density Parity-Check Codes With Short Block Lengths". IEEE Transactions on information theory, vol. 52, No. 2, Feb. 2006.,pp. 728-738.
[22] Cuizhu Shi; Ramamoorthy, A., "Design and analysis of E2RC codes," in Selected Areas in Communications, IEEE Journal on , vol. 27, No. 6, pp. 889-898, Aug. 2009.
[23] R. C. Bose, "On the construction of balanced incomplete block designs", Ann. Eugenics 9 (1939), pp. 353-399.
[24] Lan Lan; Ying Yu Tai; Shu Lin; Memari, Behshad; Honary, B., "New constructions of quasi-cyclic LDPC codes based on special classes of BIBDs for the AWGN and binary erasure channels," Communications, IEEE Transactions on , vol. 56, No. 1, pp. 39-48.
[25] Yu Kou; Shu Lin; Fossorier, M.P.C., "Low-density parity-check codes based on finite geometries: a rediscovery and new results," Information Theory, IEEE Transactions on , vol. 47, No. 7, pp. 2711-2736.
[26] Tom Høholdt, Heeralal Janwa, "Eigenvalues and expansion of bipartite graphs Designs Codes and Cryptography". Dec. 2012; 65(3), pp. 259-273.
[27] Tom Høholdt, Heeralal Janwa ,"Optimal Bipartite Ramanujan Graphs from Balanced Incomplete Block Designs: Their Characterizations and Applications to Expander/LDPC Codes." Proceeding AAECC-18 09 Proceedings of the 18th International Symposium on Applied Algebra, Algebraic Algorithms and Error-Correcting Codes pp. 53-64.
[28] Y. Hu, E. Eleftheriou, and D. M. Arnold, "Regular and Irregular Progressive Edge-Growth Tanner Graphs", IEEE Trans. on Inform. Theory, vol. 51, No. 1, pp. 386-398, 2005.
[29] H. Xiao and A. H. Banihashemi, "Improved Progressive-Edge-Growth (PEG) Construction of Irregular LDPC Codes", IEEE Communication Letters, vol. 8, No. 12, pp. 489-492, Dec. 2004.
[30] Marc P. C. Fossorier, "Quasi-cyclic low-density parity-check codes from circulant permutation matrices", IEEE Trans. Inf. Theory, vol. 50, No. 8, pp. 1788-1793 2004
[31]Yige Wang; Draper, S.C.; Yedidia, J.S., "Hierarchical and High-Girth QC LDPC Codes," Information Theory, IEEE Transactions on , vol. 59, No. 7, pp. 4553,4583, Jul. 2013.
[32] Yang, M.; Ryan, W.E.; Yan Li, "Design of efficiently encodable moderate-length high-rate irregular LDPC codes," in Communications, IEEE Transactions on , vol. 52, No. 4, pp. 564-571, Apr. 2004.
[34] Yang, M.; Ryan, W.E.; Yan Li, "Design of efficiently encodable moderate-length high-rate irregular LDPC codes," in Communications, IEEE Transactions on , vol. 52, No. 4, pp. 564-571, Apr. 2004.
[36] I. Vorobyev, N. Polyanskii, G. Svistunov, S. Egorov and V. Usatyuk, "Generalization of Floor Lifting for QC-LDPC Codes:

(56) References Cited

OTHER PUBLICATIONS

Theoretical Properties and Applications," 2018 IEEE East-West Design and Test Symposium (EWDTS), Kazan, 2018, pp. 1-6.
Smarandache, R.; Vontobel, P.O., "Quasi-Cyclic LDPC Codes: Influence of Proto- and Tanner-Graph Structure on Minimum Hamming Distance Upper Bounds",IEEE Transactions on Information Theory ( vol. 58 , Issue: 2 , Feb. 2012 ),pp. 585-607.
[21] C30-20061204-061 TSG-C WG3 Sung-Eun Park, Seung-HoonChoi, Hongsil Jeong, Jerry Kim, Jay Yu, Eddy Kwon, Jin-Kyu Han, Donghee Kim LDPC Proposal for LBC FDD, Dec. 4-8, 2006, Maui, HI,total 10 pages.
[22] C30-20070212-024 TSG-C WG3 Sung-Eun Park, Seung-HoonChoi, Hongsil Jeong, Jerry Kim, Jay Yu, Eddy Kwon, Jin-Kyu Han, Donghee Kim LDPC Proposal for LBC FDD, Feb. 12-16, 2007. Seoul, Korea ,total 30 pages.
[23] C30-20070212-024A1 TSG-C WG3 Sung-Eun Park, Seung-HoonChoi, Hongsil Jeong, Jerry Kim, Jay Yu, Eddy Kwon, Jin-Kyu Han, Donghee Kim LDPC Proposal for LBC FDD, Supply material with Samsung parity-check matrices. Feb. 12-16, 2007, Seoul, Korea,total 21 pages.
Lu Liu et al, "Efficient encoding of quasi-cyclic LDPC codes with continuously variable length", 2012 2nd International Conference on Consumer Electronics, Communications and Networks (CECNet), Date Added to IEEE Xplore: May 17, 2012. (4 pages).
Office Action dated May 13, 2020, issued in counterpart CN application No. 201680090820.1, with English translation. (8 pages).
Search Report dated May 6, 2020, issued in counterpart CN application No. 2016800908201, with English translation. (4 pages).
Office Action dated Oct. 7, 2020, issued in counterpart IN Application No. 201917019480, with English Translation. (7 pages).
Issue Notification dated Dec. 4, 2020, issued in counterpart CN Application No. 201680090820.1, with English Translation. (5 pages).
Notice of Allowance dated Dec. 4, 2020, issued in counterpart CN Application No. 201680090820.1, with English Translation. (3 pages).

* cited by examiner

METHOD AND APPARATUS FOR ENCODING AND DECODING OF VARIABLE LENGTH QUASI-CYCLIC LOW-DENSITY PARITY-CHECK, QC-LDPC, CODES

CROSS-REFERENCE TO RELATED APPLICATIONS

This application is a continuation of International Application No. PCT/RU2016/000777, filed on Nov. 14, 2016, the disclosure of which is hereby incorporated by reference in its entirety.

TECHNICAL FIELD

The present embodiments of the invention relate to a method for quasi-cyclic low-density parity-check (QC-LDPC) encoding and decoding and an apparatus for quasi-cyclic low-density parity-check encoding and decoding.

The present embodiments of the invention also relate to a computer-readable storage medium storing program code, the program code comprising instructions for carrying out such a method.

BACKGROUND

Error-correcting coding is an efficient method to improve capacity of a communication system. Wireless systems may require employing a large set of code with different length and rate. For example LTE provides more than several thousand of different code lengths and rates using a hardware friendly interleaver and simply puncturing pattern, but the sequential nature of the BCJR decoder of Turbo code significantly limits parallelism decoder throughput. Hence, it is thus a problem how to create a compact representation of QC-LDPC codes, which supports sets of QC-LDPC codes with different lengths and rates. Other problems to be solved include getting additive increase of circulant size to minimize gap between several lengths of code; to define some block-structured memory efficient puncture pattern with minimal performance lost; and to maximize number of variable node in block-structured which recover under practical number iteration.

A problem of existing floor lifting methods is the possibility of appearing of short cycles in parity check matrices and bad weight spectrum of codewords. This leads to lower code gain.

SUMMARY

The objective of the present embodiments of the invention is to provide a method for quasi-cyclic low-density parity-check encoding and decoding and an apparatus for quasi-cyclic low-density parity-check encoding and decoding, wherein the method for QC-LDPC encoding and decoding and the apparatus for QC-LDPC encoding and decoding overcome one or more of the above-mentioned problems of the prior art. Aspects of the embodiments of the invention provide error correction, especially to channel coding for wireless communication, such as WI-FI or 5G communication.

The foregoing and other objects are achieved by the features of the independent claims. Further implementation forms are apparent from the dependent claims, the description and the figures.

A first aspect of the embodiments of the invention provides a method for quasi-cyclic low-density parity-check (QC-LDPC) encoding and decoding of a data packet by a lifted matrix, obtained by floor scale modular lifting of a base matrix of QC-LDPC code, the method comprising: lifting the QC-LDPC code for maximal code length $N_{max}$ and maximal circulant size $Z_{upper}$ of the base matrix, $N_{max}=Z_{upper}*L$, wherein L is a column in the base matrix; generating a plurality of optimal values $r_i$ for a plurality of circulants $Z_1, Z_2, \ldots, Z_{upper}$ based on the QC-LDPC code lifted for maximal length $N_{max}$, $0 \le r_i \le Z_{upper}-1$; saving the generated plurality of optimal values $r_i$ corresponding to the plurality of circulants $Z_1, Z_2, \ldots, Z_{upper}$ and a matrix for the QC-LDPC code lifted for maximal length $N_{max}$ the memory unit. These steps may be made offline only once. The method further comprises receiving a current circulant $Z_{current}$ from the plurality of circulants $Z_1, Z_2, \ldots, Z_{upper}$; selecting a current optimal value $r_{current}$ from the plurality of optimal values $r_i$ stored in the memory unit corresponding to the current circulant $Z_{current}$; and lifting the base matrix based on the current optimal value $r_{current}$, wherein a floor lifting of the base matrix is calculated as:

$$E(H_{current}) = \left\lfloor \frac{Z_{current}}{Z_{upper}} ((E(H_{upper}) * r_{current}) \bmod Z_{upper}) \right\rfloor,$$

where $E(H_{upper})$ is a value of circulant shift in the base matrix for maximal circulant size; wherein $0 \le r_{current} \le Z_{upper}-1$ and $r_{current}=1$ is excluded. Therefore, a QC-LDPC mother code lifting method with flexible length and rate is provided to be used for encoding and decoding of data packets. This method provides memory efficient QC-LDPC code representation with maximal flexibility of length and rate. The overall code performance is also therefore increased due to providing memory consumption and processing speed increase.

The methods according to the first aspect of the embodiments of the invention can be performed by a computer-readable storage medium according to the second aspect of the embodiments of the invention. Further features or implementations of the method according to the first aspect of the embodiments of the invention can perform the functionality of an apparatus for QC-LDPC encoding and decoding according to the third aspect of the embodiments of the invention and its different implementation forms.

In a first implementation of the method for QC-LDPC encoding and decoding of a data packet by a lifted matrix according to the first aspect, generating the plurality of optimal values $r_i$ for the plurality of circulants $Z_1, Z_2, \ldots, Z_{upper}$ further comprises: constructing a plurality of families of parity-check matrixes, each family corresponds to value r in a plurality of values $r_1, r_2, \ldots, r_k$ corresponding to code lengths $N_1, N_2, N_3, \ldots, N_k$; and based on the plurality of the families of the parity-check matrixes, selecting the plurality of optimal values $r_i$ for the plurality of circulants $Z_1, Z_2, \ldots, Z_{upper}$ by multi-parameter filtering. Using at least one parity-check matrix a set of code can be represented with minimal performance degradation and high memory efficiency.

In a second implementation of the method for QC-LDPC encoding and decoding of a data packet by a lifted matrix according to the first implementation of the first aspect, the multi-parameter filtering includes at least on of: Extrinsic Message Degree, ACE Spectrum, Tanner Spectral Bound, Code Distance, Codeword's weight spectrum enumerator, Trapping Set Weight Enumerator, simulations result. All these ways of choosing best r value provide improved filtering quality due to better consideration of multiple parameters and enable choosing the optimal r value to be used in a lifting procedure.

In a third implementation of the method for QC-LDPC encoding and decoding of a data packet by a lifted matrix according to any of the first or second implementations of the first aspect, constructing the plurality of the families of the parity-check matrixes is performed using formula: $E_r(H_{upper})=E(H_{upper})\cdot r \bmod Z_{upper}$. Using $E_r(H_{upper})$ provides additional flexibility due to possibility to choose r value to avoid critical points.

A second aspect of the embodiments of the invention refers to a a computer-readable storage medium storing program code, the program code comprising instructions for carrying out the method of the first aspect or one of the implementations of the first aspect.

A third aspect of the embodiments of the invention refers to an apparatus for quasi-cyclic low-density parity-check (QC-LDPC) encoding and decoding of a data packet by a lifted matrix, obtained by floor scale modular lifting of a base matrix of QC-LDPC code, the apparatus comprising a processing unit and a memory unit, the memory unit storing: a maximal length $N_{max}$ and a maximal circulant size $Z_{upper}$ of the base matrix, a matrix for the QC-LDPC code lifted for maximal length $N_{max}$; and a plurality of optimal values $r_i$ corresponding to a plurality of circulants $Z_1, Z_2, \ldots, Z_{upper}$, the plurality of optimal values $r_i$ is generated based on the QC-LDPC code lifted for maximal length $N_{max}$ and maximal circulant size $Z_{upper}$ of the base matrix, wherein $N_{max}=Z_{upper}*L$, L is a column in the base matrix and $0 \leq r_i \leq Z_{upper}-1$. The processing unit is configured to: receive a current circulant $Z_{current}$ from the plurality of circulants $Z_1, Z_2, \ldots, Z_{upper}$, select a current optimal value $r_{current}$ from the plurality of optimal values $r_i$ stored in the memory unit corresponding to the current circulant $Z_{current}$; and lift the base matrix based on the current optimal value $r_{current}$, wherein a floor lifting of the base matrix is calculated as:

$$E(H_{current}) = \left\lfloor \frac{Z_{current}}{Z_{upper}}((E(H_{upper}) * r_{current}) \bmod Z_{upper}) \right\rfloor,$$

where $E(H_{upper})$ is a value of circulant shift in the base matrix for maximal circulant size; wherein $0 \leq r_{current} \leq Z_{upper}-1$ and $r_{current}=1$ is excluded.

In a first implementation of the apparatus for QC-LDPC encoding and decoding of a data packet by a lifted matrix of the third aspect, generating the plurality of optimal values $r_i$ for the plurality of circulants $Z_1, Z_2, \ldots, Z_{upper}$ comprises: constructing a plurality of families of parity-check matrixes, each family corresponds to value r in a plurality of values $r_1, r_2, \ldots, r_k$ corresponding to code lengths $N_1, N_2, N_3, \ldots, N_k$; and based on the plurality of the families of the parity-check matrixes, selecting the plurality of optimal values $r_i$ for the plurality of circulants $Z_1, Z_2, \ldots, Z_{upper}$ by multi-parameter filtering.

In a second implementation of the apparatus for QC-LDPC encoding and decoding of a data packet by a lifted matrix according to the first implementation of the third aspect, the multi-parameter filtering includes at least on of: Extrinsic Message Degree, ACE Spectrum, Tanner Spectral Bound, Code Distance, Codeword's weight spectrum enumerator, Trapping Set Weight Enumerator, simulations result.

In a third implementation of the apparatus for QC-LDPC encoding and decoding of a data packet by a lifted matrix according to any of the first or second implementations of the third aspect, the processing unit is further configured to construct the plurality of the families of the parity-check matrixes using formula: $E_r(H_{upper})=E(H_{upper})\cdot r \bmod Z_{upper}$.

All the implementations of the first aspect may be easily combined and used together with all the implementations of the third aspect.

These and other aspects of the embodiments of the invention will be apparent from the embodiments described below.

BRIEF DESCRIPTION OF DRAWINGS

To illustrate the technical features of embodiments of the present invention more clearly, the accompanying drawings provided for describing the embodiments are introduced briefly in the following. The accompanying drawings in the following description are merely some embodiments of the present invention, modifications on these embodiments are possible without departing from the scope of the present embodiments of the invention as defined in the claims.

DESCRIPTION OF EMBODIMENTS

Figure 1:
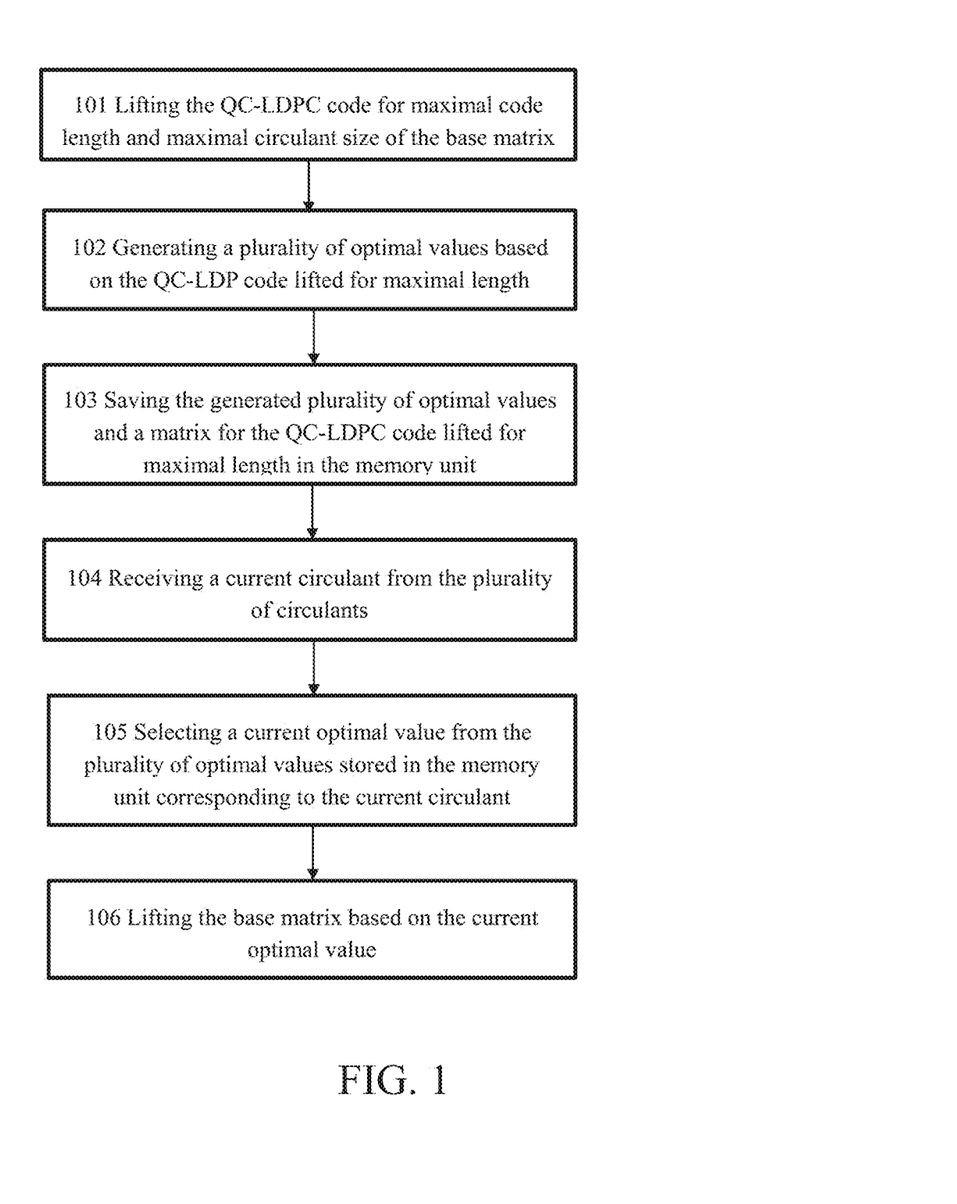
FIG. 1 is a flow chart of a method for QC-LDPC encoding and decoding of a data packet by a lifted matrix in accordance with an embodiment of the present invention.

FIG. 1 illustrates a method 100 for QC-LDPC encoding and decoding of a data packet by a lifted matrix in accordance with the first aspect of the embodiments of the invention. The lifted matrix is obtained by floor scale modular lifting of a base matrix of QC-LDPC code. The method starts at block 101, where the QC-LDPC code for maximal code length $N_{max}$ and maximal circulant size $Z_{upper}$ of the base matrix is lifted:

$$N_{max}=Z_{upper}*L, \quad (1)$$

wherein L is a column in the base matrix.

At step 102 a plurality of optimal values $r_i$ for a plurality of circulants $Z_1, Z_2, \ldots, Z_{upper}$ is generated based on the QC-LDPC code lifted for maximal length $N_{max}$, $0 \leq r_i \leq Z_{upper}-1$. The generated plurality of optimal values $r_i$ corresponding to the plurality of circulants $Z_1, Z_2, \ldots, Z_{upper}$ and a matrix for the QC-LDPC code lifted for maximal length $N_{max}$ are saved in the memory unit at step 103. At step 104 a current circulant $Z_{current}$ from the plurality of circulants $Z_1, Z_2, \ldots, Z_{upper}$ is received. Then a current optimal value $r_{current}$ is selected from the plurality of optimal values $r_i$ stored in the memory unit corresponding to the current circulant $Z_{current}$ (step 105). Finally at step 106 the base matrix is lifted based on the current optimal value $r_{current}$. A floor lifting of the base matrix is calculated as:

$$E(H_{current}) = \left\lfloor \frac{z_{current}}{z_{upper}} ((E(H_{upper}) * r_{current}) \bmod z_{upper}) \right\rfloor, \quad (2)$$

where $E(H_{upper})$ is a value of circulant shift in the base matrix for maximal circulant size; wherein $0 \leq r_{current} \leq z_{upper}-1$ and $r_{current}=1$ is excluded.

The method for QC-LDPC encoding and decoding in accordance with the present embodiment of the invention may be widely used, for example in cryptography, in data transfer and for data storage.

A (J,L) regular QC-LDPC code of length N is usually defined by a parity-check matrix:

$$H = \begin{bmatrix} I(p_{0,0}) & I(p_{0,1}) & \cdots & I(p_{0,L-1}) \\ I(p_{1,0}) & I(p_{1,1}) & & I(p_{1,L-1}) \\ \vdots & \vdots & \ddots & \vdots \\ I(p_{J-1,0}) & I(p_{J-1,1}) & \cdots & I(p_{J-1,L-1}) \end{bmatrix} \quad (3)$$

where $1 \leq j \leq J-1$, $1 \leq l \leq L-1$ and $I(p_{j,l})$ represents the p×p circulant permutation matrix obtained by cyclically right-shifting the p×p identity matrix I(0) by $p_{j,l}$ positions, with p=N/L.

For a specific QC-LDPC code the corresponding "base matrix" ("mother matrix" or protograph) is defined as the matrix of circulant shift that defines the QC-LDPC code:

$$B = \begin{bmatrix} p_{0,0} & p_{0,1} & \cdots & p_{0,L-1} \\ p_{1,0} & p_{1,1} & & p_{1,L-1} \\ \vdots & \vdots & \ddots & \vdots \\ p_{J-1,0} & p_{J-1,1} & \cdots & p_{J-1,L-1} \end{bmatrix}. \quad (4)$$

Mask matrix for which regular QC-LDPC code can become irregular for different column weight case or QC-LDPC regular code with zero block circulant may be defined as:

$$M = \begin{bmatrix} m_{0,0} & m_{0,1} & \cdots & m_{0,L-1} \\ m_{1,0} & m_{1,1} & & m_{1,L-1} \\ \vdots & \vdots & \ddots & \vdots \\ m_{J-1,0} & m_{J-1,1} & \cdots & m_{J-1,L-1} \end{bmatrix}. \quad (5)$$

$$H = H \otimes M, \quad (6)$$

where ⊗ is Hadamard product.

Lifting is operation under base matrix (protograph), by using of which code with different authomorphism or circulant size from a similar base matrix can be obtained.

Normally floor-lifting of base matrix is calculated by formula:

$$E(H_{current}) = \left\lfloor \frac{z_{current}}{z_{upper}} E(H_{upper}) \right\rfloor, \quad (7)$$

where $z_{current}$—lifting size of circulant,
$z_{upper}$—maximal circulant size of base matrix,
$E(H_{upper})$—value of circulant shift in base matrix for maximal size of circulant.

Length of code N from $z_{current}*VN_{protograph}$ to $z_{upper}*VN_{protograph}$ with some additive step between $z_{current}$: step:$z_{upper}$, where $VN_{protograph}$ is number of variable nodes in base matrix.

The method according to the present embodiment of the invention uses random matrix design approach lifting QC-LDPC directly from mask matrix (base matrix or protograph).

A cycle of even length 2K in H is defined by 2K positions such that:

1) Two consecutive positions are obtained by changing alternatively column of row only;
2) All positions are distinct except first and last one;

Two consecutive elements of the path belong to different circulant permutation matrices. So a chain of circulant permutation matrices can be defined:

$$I(p_{i_0,j_0}), I(p_{i_0,j_1}), I(p_{i_1,j_1}), I(p_{i_1,j_2}), \ldots, I(p_{i_{K-1},j_{K-1}}), I(p_{i_{K-1},j_0}), I(p_{i_0,j_0}) \quad (8)$$

where $i_a \neq i_{a+1}$, $j_a \neq j_{a+1}$, for all $0 \leq a \leq K-1$.

As each part of cycle is one, the circulant permutation matrix $I(p_{i,j})$ participating in cycle cannot be empty. Using these shifts of identity matrix necessary and sufficient conditions of existing of the cycle can be defined as:

$$\Sigma_{a=0}^{K-1} p_{i_a,j_a} - p_{i_a,j_{a+1}} \equiv 0 (\bmod N) \quad (9)$$

Figure 2:
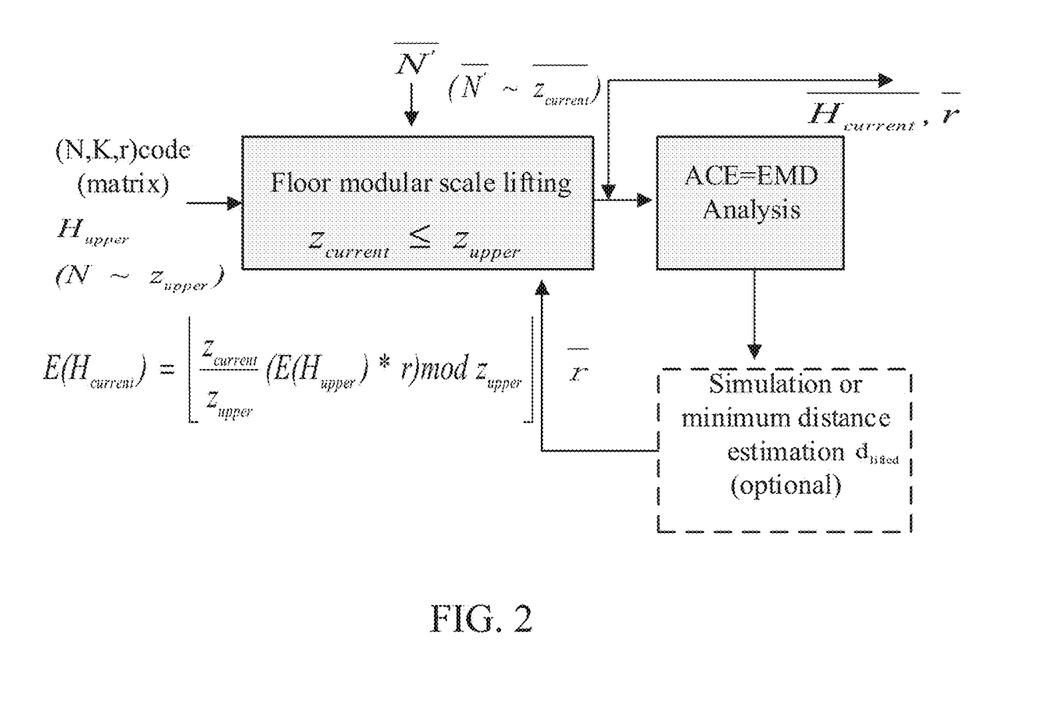
FIG. 2 shows generating a lifting value r for floor-scale modular lifting method in accordance with the present embodiment of the invention, FIGS. 3 (A) and (B) show an example of critical points elimination due to changing r values.

FIG. 2 illustrates generating a lifting value r for floor-scale modular lifting method. To generate a lifting value (code for flexible length $N_1 < N_2 < N_3 < N_4 < \ldots < N_k < N_{max}$) using floor scale modular approach QC-LDPC lifted for maximal length $N_{max}$ is used. This matrix can be lifted using simulation annulling, hill-climbing, guest-and-search, PEG, ACE+PEG or any another algorithms:

$$M = \begin{bmatrix} m_{0,0} & m_{0,1} & \cdots & m_{0,L-1} \\ m_{1,0} & m_{1,1} & & m_{1,L-1} \\ \vdots & \vdots & \ddots & \vdots \\ m_{J-1,0} & m_{J-1,1} & \cdots & m_{J-1,L-1} \end{bmatrix} \quad (10)$$

The input for floor modular scale lifting represents a QC-LDPC code lifted for maximal circulant size $Z_{upper}$ with L variable nodes (columns in base matrix) and J parity-check (rows in base matrix):

$$Z_{upper}*L = N_{max}. \quad (11)$$

Circulant sizes for which lifting this base matrix is desired: $Z_1 < Z_2 < \ldots < Z_k < Z_{upper}$, to get lengths $Z_1*L=N_1 < Z_2*L=N_2 < Z_3*L=N_3 < Z_4*L=N_4 < \ldots < Z_{upper}*L=N_{max}$. The output of the floor modular scale lifting represents scale values $r_1, r_2, \ldots, r_k$ for every circulant sizes $Z_1, Z_2, \ldots, Z_k$. By using these values it is possible to generate code for every code lengths $N_1, N_2, N_3, \ldots, N_k$ in a fast manner using formula (12).

QC-LDPC code lifted for maximal code length is received and for every value $r_1, r_2, \ldots, r_k$ (related to circulants size $Z_1, Z_2, \ldots, Z_k$) which corresponds to codes with lengths $N_1, N_2, N_3, \ldots, N_k$ using formula (12) i parity-check matrixes are determined. Every $r_{current}$ can be in the range $1 \ldots Z, -1$. After using multi-parameter sieving, best value r is chosen based on: Extrinsic Message Degree, ACE Spectrum, Tanner Spectral Bound, Code Distance, Codeword's weight spectrum enumerator, Trapping Set Weight Spectrum Enumerator, simulation result, as shown in FIG. 2 by ACE=EMD Analysis.

This procedure may be made offline only once, then a matrix lifted for maximal length is saved along with r values.

After value $r_i$ is got for every circulant $Z_1, Z_2, \ldots, Z_{upper}$ parity-check matrix for every length $N_1, N_2, N_3, \ldots, N_k$ can be constructed using formula:

$$E_r(H_{upper}) = E(H_{upper}) \cdot r \bmod z_{upper} \quad (12)$$

where r is integer $1 \leq r \leq z_{upper}-1$ and $GCD(r, z_{upper})=1$.

For any path P shift $d'_P$ in the $E_r(H_{upper})$ is equal to r times of shift $d_P$ by same path in $E(H_{upper})$:

$$d'_p \equiv \sum_{a=0}^{K-1} rp_{i_a,j_a} - rp_{i_a,j_{a+1}} \pmod{z_{upper}} \equiv \equiv \quad (13)$$

$$r \sum_{a=0}^{K-1} p_{i_a,j_a} - p_{i_a,j_{a+1}} \pmod{z_{upper}} \equiv r \, dp$$

When $GCD(r, z_{upper})=1$, $d'_p \equiv 0 \pmod{z_{upper}}$ in the same time with $d_p \equiv 0 \pmod{z_{upper}}$.

Figure 3:
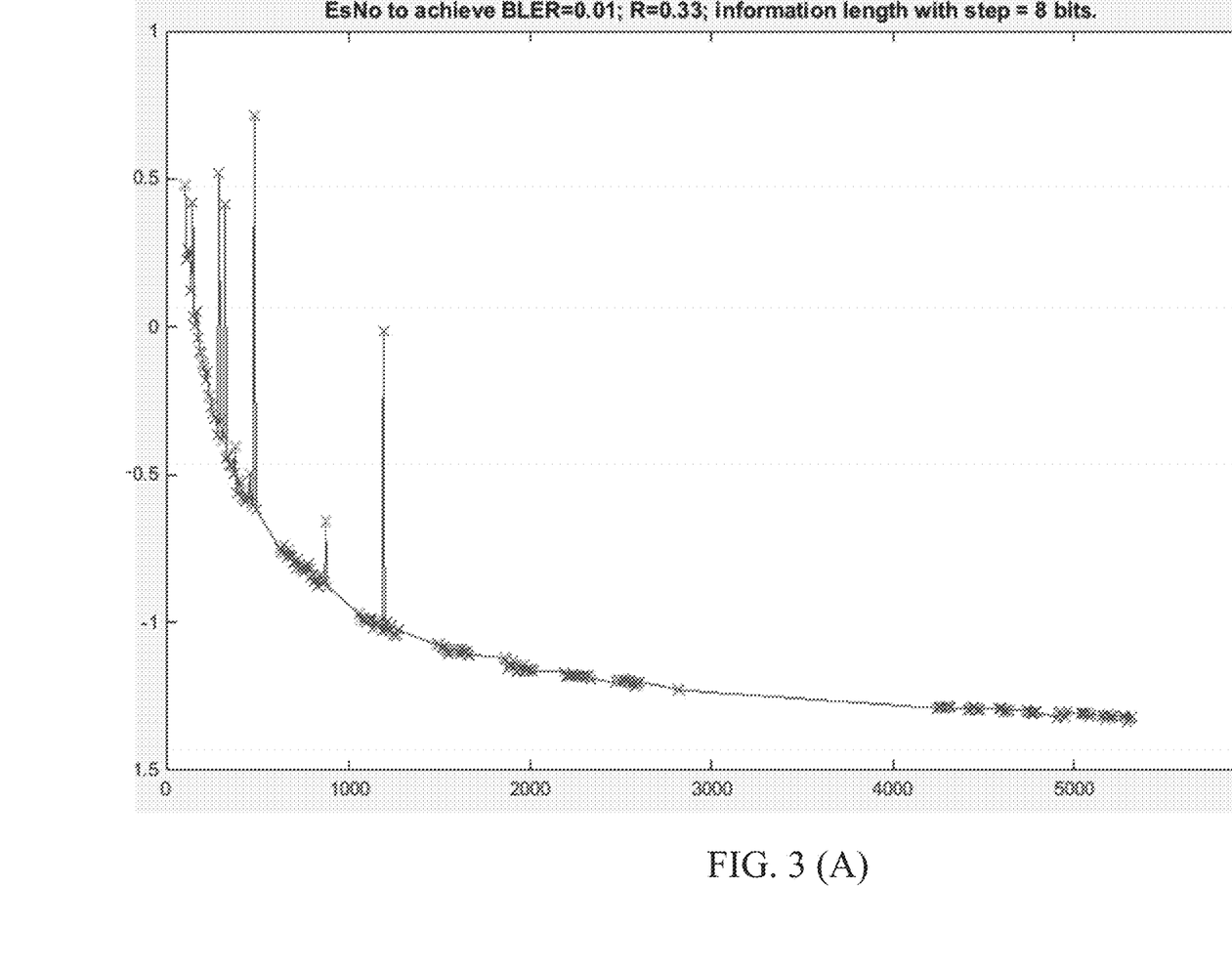

So, structure of cycles of $E(H_{upper})$ and $E\_r(H_{upper})$ are equivalent. In comparison with classical floor lifting approach, this method provides additional freedom and flexibility. Such r can be chosen as to avoid catastrophic (critical) points and to improve quality of graph in general, example of improving using change of r is presented in FIG. 3.

Combining formula (12) with formula (7) of classical floor-lifting of base matrix the following formula for a floor lifting can be obtained:

$$E(H_{current}) = \left\lfloor \frac{z_{current}}{z_{upper}}((E(H_{upper}) * r_{current}) \bmod z_{upper}) \right\rfloor, \quad (14)$$

where $r_{current}$-scale factor, being an integer value from $0 \ldots z_{upper}-1$, $$CGD(r_{current}, z_{upper})=1.$$

This increases freedom and flexibility of floor lifting.

For each $z_{current}$ we can find such $r_{current}$ that bring best possible quality of $E(H_{current})$. This method can be applied to any QC-LDPC codes to get flexible length properties.

Figure 4:
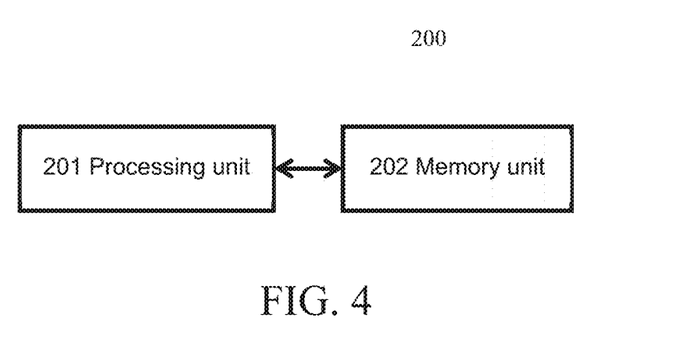
FIG. 4 is a simplified block diagram illustrating an apparatus for QC-LDPC encoding and decoding of a data packet by a lifted matrix in accordance with an embodiment of the present invention.

FIG. 4 illustrates an apparatus 200 for QC-LDPC encoding and decoding of a data packet by a lifted matrix comprising a processing unit 201 and a memory unit 202. The memory unit 202 stores: a maximal length $N_{max}$ and a maximal circulant size $Z_{upper}$ of the base matrix, a matrix for the QC-LDPC code lifted for maximal length $N_{max}$; and a plurality of optimal values $r_i$ corresponding to a plurality of circulants $Z_1, Z_2, \ldots, Z_{upper}$. The plurality of optimal values $r_i$ is generated based on the QC-LDPC code lifted for maximal length $N_{max}$ and maximal circulant size $Z_{upper}$ of the base matrix. The processing unit 201 is configured to: receive a current circulant $Z_{current}$ from the plurality of circulants $Z_1, Z_2, \ldots, Z_{upper}$; select a current optimal value $r_{current}$ from the plurality of optimal values $r_i$ stored in the memory unit corresponding to the current circulant $Z_{current}$; and lift the base matrix based on the current optimal value $r_{current}$.

Figure 5A:
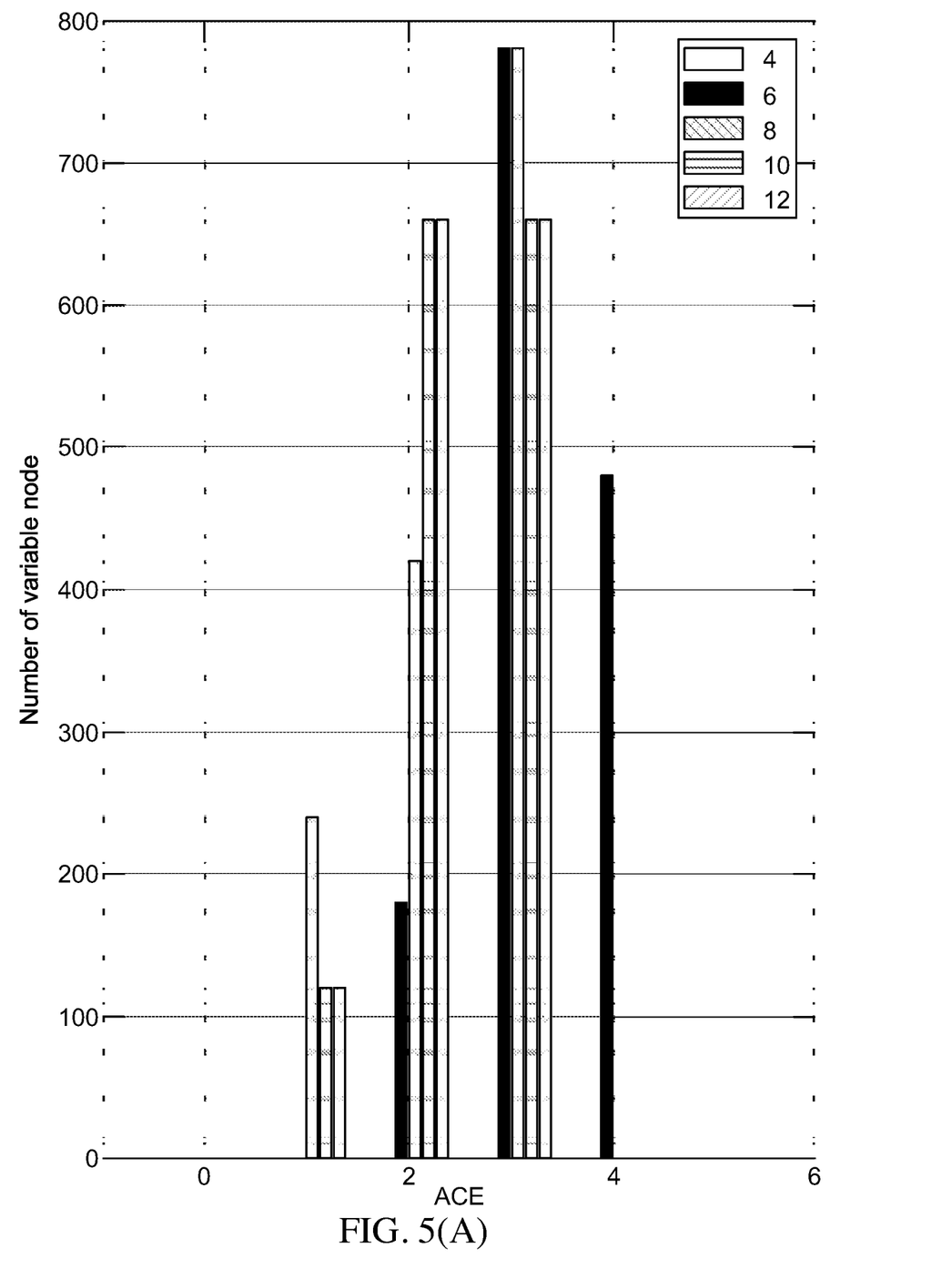
FIGS. 5-7 show comparison of the floor lifting in accordance with the present embodiment of the invention with traditional floor lifting.
Figure 5B:
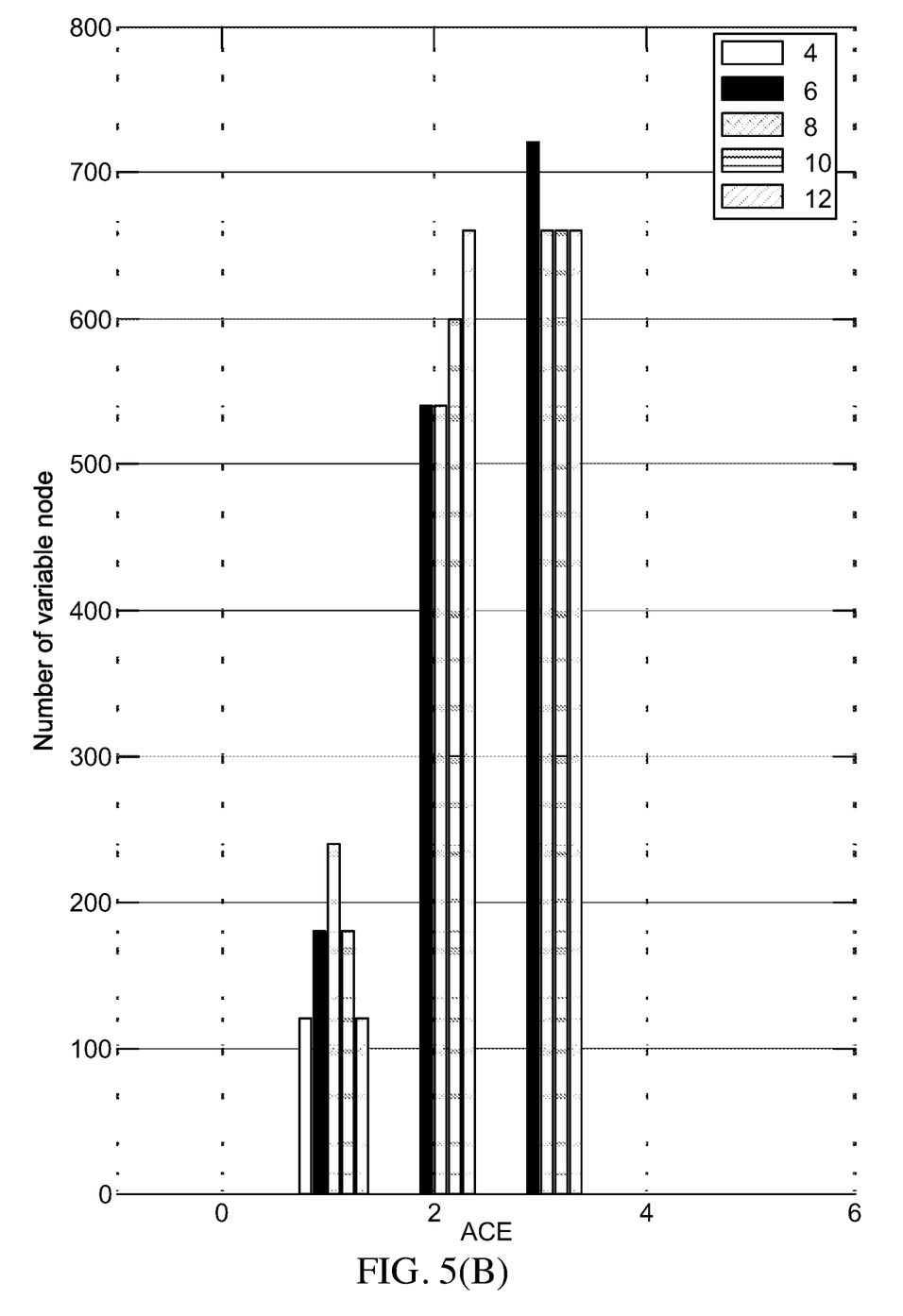
Figure 6:
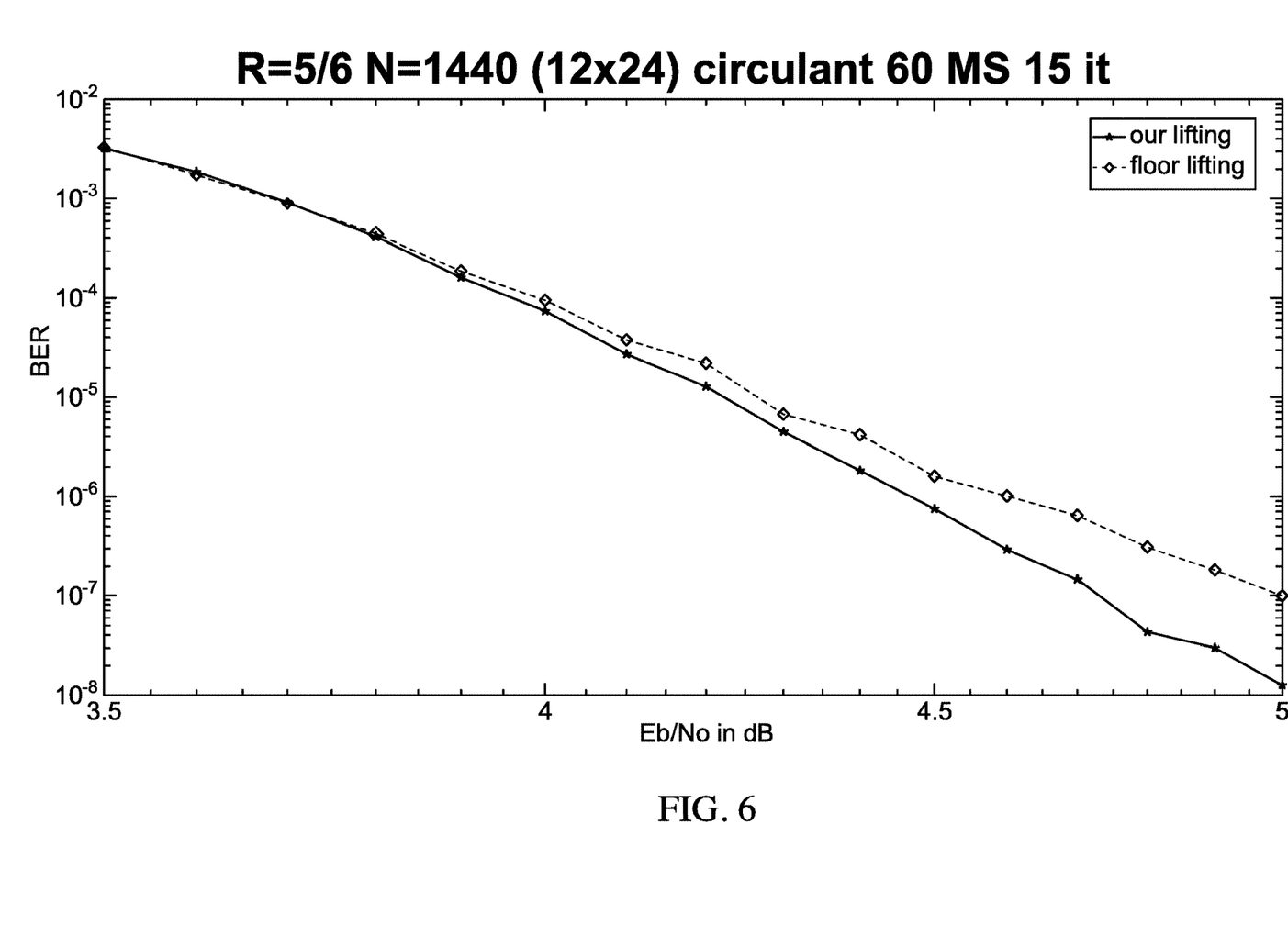
Figure 7:
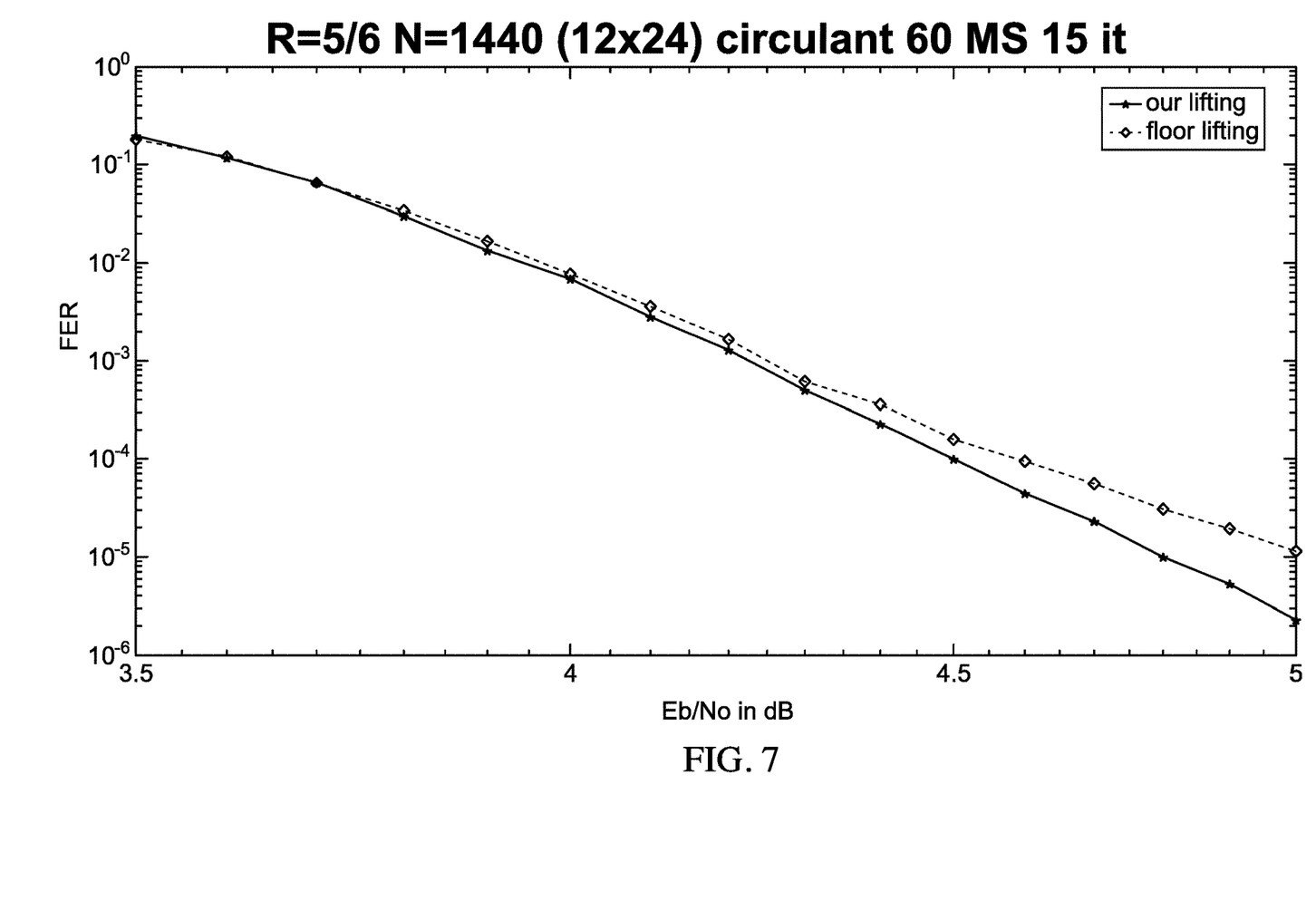

Comparison of the floor lifting in accordance with the present embodiment of the invention with traditional floor lifting is further provided with the reference to FIGS. 5-7. For simplicity of the comparison, the extended irregular repeat-accumulate (EIRA) QC-LDPC base matrix is lifted. Designed QC-LDPC is:

| 60 | 54 | 75 | -1 | 69 | 38 | -1 | 9 | 84 | 4 | 8 | 39 | 32 | 64 | 92 | 79 | 1 | 56 | 17 | 0 | 7 | 0 | -1 | -1 |
| -1 | 73 | -1 | 3 | 10 | 70 | 25 | 37 | 46 | -1 | 47 | 46 | 44 | 56 | 55 | 81 | 43 | 59 | 62 | 53 | 0 | 0 | 0 | -1 |
| 92 | 81 | 86 | 58 | 4 | -1 | 66 | -1 | 13 | 81 | 92 | 56 | 48 | 94 | 20 | 29 | 44 | 22 | 2 | 21 | -1 | -1 | 0 | 0 |
| 31 | -1 | 83 | 71 | -1 | 89 | 11 | 42 | 23 | 40 | 62 | 31 | 81 | 74 | 82 | 25 | 42 | 13 | 86 | 70 | 7 | -1 | -1 | 0 |

Table 1 contains a comparison of the lifting approach in accordance with the provided method and a traditional floor lifting approach based on the number of cycles.

TABLE 1

| Floor scale modular lifting in accordance with provided method | | | Traditional floor lifting | | |
|---|---|---|---|---|---|
| $z_{current}$ | cycles | Number of cycles; r | $z_{current}$ | cycles | Number of cycles; r |
| 24 | 6 | 669; r = 4 | 24 | 4 | 2; r = 1 |
| 28 | 6 | 583; r = 28 | 28 | 4 | 2; r = 1 |
| 32 | 6 | 508; r = 52 | 32 | 4 | 1; r = 1 |
| 36 | 6 | 439; r = 20 | 36 | 4 | 1; r = 1 |
| 40 | 6 | 420; r = 28 | 40 | 4 | 1; r = 1 |
| 44 | 6 | 364; r = 76 | 44 | 4 | 1; r = 1 |
| 48 | 6 | 238; r = 2 | 48 | 4 | 1; r = 1 |
| 52 | 6 | 341; r = 20 | 52 | 4 | 1; r = 1 |
| 56 | 6 | 217; r = 14 | 56 | 4 | 1; r = 1 |
| 60 | 6 | 195; r = 10 | 60 | 4 | 1; r = 1 |
| 64 | 6 | 179; r = 74 | 64 | 6 | 263; r = 1 |
| 68 | 6 | 177; r = 86 | 68 | 6 | 223; r = 1 |
| 72 | 6 | 151; r = 58 | 72 | 6 | 228; r = 1 |
| 76 | 6 | 153; r = 94 | 76 | 6 | 223; r = 1 |
| 80 | 6 | 144; r = 14 | 80 | 6 | 205; r = 1 |
| 84 | 6 | 139; r = 82 | 84 | 6 | 201; r = 1 |
| 88 | 6 | 130; r = 38 | 88 | 6 | 197; r = 1 |
| 92 | 6 | 132; r = 86 | 92 | 6 | 178; r = 1 |
| $z_{upper}$ = 96 | 6 | 68; r = 1 | $z_{upper}$ = 96 | 6 | 173; r = 1 |

Comparison based on the ACE Spectrum for lifting with circulant size $z_{current}=60$, N=1440 is provided in FIGS. 5 (A) and (B), where ACE Spectrum of floor scale modular lifting in accordance with the provided method (A) and traditional floor lifting (B) under similar base matrix are provided.

BER performance comparison of traditional floor-lifting QC-LDPC and QC-LDPC lifted using the provided approach of same base-matrix under min-sum decoder 15 iterations under AWGN channel is illustrated in FIG. 6. FER performance comparison of traditional floor-lifting QC-LDPC and QC-LDPC lifted using the provided approach of same base-matrix under min-sum decoder 15 iterations under AWGN channel is illustrated in FIG. 7.

Using the floor scale modular lifting method described in the present description the following two parity-check matrix of Repeat Accumulate QC-LDPC code may be designed: 12×24 circulant from 28 to 2304 with step 4, length 672 to 55296 with step 96, rate 0.5

| | | | | | | | | | | | | | | | | | | | | | | | |
|---|---|---|---|---|---|---|---|---|---|---|---|---|---|---|---|---|---|---|---|---|---|---|---|
| 1105 | 1626 | −1 | −1 | −1 | 1737 | −1 | −1 | −1 | −1 | −1 | −1 | 526 | 0 | −1 | −1 | −1 | −1 | −1 | −1 | −1 | −1 | −1 | −1 |
| 1704 | −1 | 1327 | −1 | −1 | −1 | 1340 | −1 | 1438 | −1 | −1 | −1 | −1 | 0 | 0 | −1 | −1 | −1 | −1 | −1 | −1 | −1 | −1 | −1 |
| −1 | −1 | 662 | 206 | −1 | −1 | −1 | 1510 | −1 | −1 | −1 | −1 | −1 | −1 | 0 | 0 | −1 | −1 | −1 | −1 | −1 | −1 | −1 | −1 |
| −1 | 869 | 416 | −1 | 348 | 40 | −1 | −1 | −1 | 53 | −1 | −1 | −1 | −1 | −1 | 0 | 0 | −1 | −1 | −1 | −1 | −1 | −1 | −1 |
| 2196 | −1 | −1 | 1566 | −1 | 1 | −1 | −1 | −1 | −1 | 2219 | −1 | −1 | −1 | −1 | −1 | 0 | 0 | −1 | −1 | −1 | −1 | −1 | −1 |
| 2167 | −1 | 1346 | −1 | 2146 | −1 | −1 | 261 | −1 | −1 | −1 | 2033 | 0 | −1 | −1 | −1 | −1 | 0 | 0 | −1 | −1 | −1 | −1 | −1 |
| −1 | 792 | −1 | 857 | 696 | −1 | 1273 | −1 | −1 | −1 | −1 | −1 | −1 | −1 | −1 | −1 | −1 | −1 | 0 | 0 | −1 | −1 | −1 | −1 |
| −1 | 1435 | 181 | −1 | −1 | −1 | −1 | −1 | 1028 | −1 | 2292 | 1029 | −1 | −1 | −1 | −1 | −1 | −1 | −1 | 0 | 0 | −1 | −1 | −1 |
| 3 | −1 | −1 | 1427 | 370 | −1 | −1 | −1 | 1414 | 527 | −1 | −1 | −1 | −1 | −1 | −1 | −1 | −1 | −1 | −1 | 0 | 0 | −1 | −1 |
| 1433 | 2215 | −1 | −1 | −1 | −1 | 42 | 1294 | −1 | −1 | 371 | −1 | −1 | −1 | −1 | −1 | −1 | −1 | −1 | −1 | −1 | 0 | 0 | −1 |
| −1 | −1 | 2188 | 1927 | −1 | 1007 | 512 | −1 | −1 | −1 | −1 | −1 | −1 | −1 | −1 | −1 | −1 | −1 | −1 | −1 | −1 | −1 | 0 | 0 |
| −1 | 1140 | −1 | 1589 | −1 | −1 | −1 | 1567 | −1 | 1761 | −1 | 1684 | 526 | −1 | −1 | −1 | −1 | −1 | −1 | −1 | −1 | −1 | −1 | 0 | and
6×24 circulant from 4 to 2304 with step 4 length 96 to 55296 with step 96, rate 0.75

| | | | | | | | | | | | |
|---|---|---|---|---|---|---|---|---|---|---|---|
| 984 | 581 | 2108 | 942 | 855 | 1987 | 1404 | −1 | 1365 | −1 | 2025 | −1 | −1 |
| 682 | 737 | 1893 | 932 | 2126 | 185 | 1472 | 522 | −1 | 377 | 1122 | 1161 | −1 |
| 83 | 1971 | 342 | 858 | 1726 | 2205 | 815 | −1 | −1 | 109 | 671 | −1 | 1876 |
| 201 | 907 | 1490 | 191 | 272 | 1986 | 970 | 616 | 1393 | −1 | −1 | 646 | −1 |
| 2158 | 2244 | 1820 | 390 | 1445 | 2051 | 861 | −1 | 1454 | 1022 | 1163 | −1 | 139 |
| 679 | 421 | 874 | 2035 | 1806 | 723 | 2097 | 884 | −1 | −1 | −1 | 19 | 1449 |
| | | | | 667 | 719 | 804 | −1 | −1 | 899 | 0 | −1 | −1 −1 −1 |
| | | | | −1 | −1 | −1 | 934 | 212 | −1 | 0 | 0 | −1 −1 −1 |
| | | | | 442 | −1 | 447 | 1576 | −1 | 0 | −1 | 0 | 0 −1 −1 |
| | | | | −1 | 930 | 270 | −1 | 629 | −1 | −1 | −1 | 0 0 −1 |
| | | | | 742 | −1 | −1 | −1 | −1 | −1 | −1 | −1 | −1 0 0 |
| | | | | −1 | 1793 | −1 | 1081 | 275 | 899 | −1 | −1 | −1 −1 0 |

The foregoing descriptions are only implementation manners of the present embodiments of the invention, the scope of the present embodiments of the invention is not limited to this. Any variations or replacements can be easily made through person skilled in the art. Therefore, the protection scope of the present embodiments of the invention should be subject to the protection scope of the attached claims.

The invention claimed is:

1. A method for quasi-cyclic low-density parity-check (QC-LDPC) encoding and decoding, comprising:
receiving a data packet;
determining a circulant $Z_{current}$ from a plurality of circulants $Z_1, Z_2, \ldots, Z_{upper}$;
selecting a value $r_{current}$ from a plurality of values $r_i$ stored in a memory corresponding to the circulant $Z_{current}$;
obtaining a lifted matrix based on the value $r_{current}$; and
performing QC-LDPC coding on the data packet for error correction based on the lifted matrix, wherein
the lifted matrix is obtained by a floor scale modular lifting of a base matrix of a QC-LDPC code,
the QC-LDPC code being lifted for a maximal code length $N_{max}$ and a maximal circulant size $Z_{upper}$ of the base matrix, $N_{max}=Z_{upper}*L$, where L is the number of columns of the base matrix,
the plurality of values $r_i$ for the plurality of circulants $Z_1, Z_2, \ldots, Z_{upper}$ are generated based on the QC-LDPC code lifted for maximal length $N_{max}$, $0 \leq r_i \leq Z_{upper}-1$,
the generated plurality of values $r_i$ corresponding to the plurality of circulants $Z_1, Z_2, \ldots, Z_{upper}$ and a matrix for the QC-LDPC code lifted for maximal length $N_{max}$ are saved in the memory, and
the floor lifting of the base matrix is calculated as:

$$E(H_{current}) = \left\lfloor \frac{Z_{current}}{Z_{upper}}((E(H_{upper})*r_{current}) \bmod Z_{upper}) \right\rfloor,$$

where $E(H_{upper})$ is a value of circulant shift in the base matrix for maximal circulant size, $H_{upper}$ is the base matrix for the maximal circulant size, and $0 \leq r_{current} \leq Z_{upper}-1$ and $r_{current}=1$ is excluded.

2. The method of claim 1, wherein the plurality of values $r_i$ corresponding to the plurality of circulants $Z_1, Z_2, \ldots, Z_{upper}$ are generated by:
constructing a plurality of families of parity-check matrixes, each family corresponds to a value r in a plurality of values $r_1, r_2, \ldots, r_k$ corresponding to code lengths $N_1, N_2, N_3, \ldots, N_k$; and
based on the plurality of the families of the parity-check matrixes, selecting the plurality of values $r_i$ corresponding to the plurality of circulants $Z_1, Z_2, \ldots, Z_{upper}$ by multi-parameter filtering.

3. The method of claim 2, wherein the multi-parameter filtering uses a method including at least one of: Extrinsic Message Degree, ACE Spectrum, Tanner Spectral Bound, Code Distance, Codeword's weight spectrum enumerator, Trapping Set Weight Enumerator, and simulations result.

4. The method of claim 2, wherein the plurality of the families of the parity-check matrixes is constructed by using equation:
$E_r(H_{upper})=E(H_{upper}) \cdot r \bmod Z_{upper}$, where $E_r(H_{upper})$ is a value of circulant shift in the base matrix for maximal circulant size corresponding to the value r.

5. A non-transitory computer readable storage medium storing program code, the program code comprising instructions, which when performed on a computer cause the computer to perform:
receiving a data packet;
determining a circulant $Z_{current}$ from a plurality of circulants $Z_1, Z_2, \ldots, Z_{upper}$;
selecting a value $r_{current}$ from a plurality of values $r_i$ stored in the memory corresponding to the circulant $Z_{current}$;
obtaining a lifted matrix based on the value $r_{current}$; and performing QC-LDPC coding on the data packet for error correction based on the lifted matrix, wherein the lifted matrix is obtained by a floor scale modular lifting of a base matrix of a QC-LDPC code, the QC-LDPC code being lifted for a maximal code length $N_{max}$ and a maximal circulant size $Z_{upper}$ of the base matrix, $N_{max}=Z_{upper}*L$, where L is the number of columns of the base matrix, the plurality of values $r_i$ for the plurality of circulants $Z_1, Z_2, \ldots, Z_{upper}$ are generated based on the QC-LDPC code lifted for maximal length $N_{max}$, $0 \le r_i \le Z_{upper}-1$, the generated plurality of values $r_i$ corresponding to the plurality of circulants $Z_1, Z_2, \ldots, Z_{upper}$ and a matrix for the QC-LDPC code lifted for maximal length $N_{max}$ are saved in a memory, and the floor lifting of the base matrix is calculated as:

$$E(H_{current}) = \left\lfloor \frac{Z_{current}}{Z_{upper}}((E(H_{upper}) * r_{current}) \bmod Z_{upper}) \right\rfloor,$$

where $E(H_{upper})$ is a value of circulant shift in the base matrix for maximal circulant size, $H_{upper}$ is the base matrix for the maximal circulant size, and $0 \le r_{current} \le Z_{upper}-1$ and $r_{current}=1$ is excluded.

6. An apparatus for quasi-cyclic low-density parity-check (QC-LDPC) encoding and decoding, the apparatus comprising a processor and a memory, wherein the memory stores:
a maximal length $N_{max}$ and a maximal circulant size $Z_{upper}$ of the base matrix,
a matrix for the QC-LDPC code lifted for maximal length $N_{max}$; and
a plurality of values $r_i$ corresponding to a plurality of circulants $Z_1, Z_2, \ldots, Z_{upper}$, the plurality of values $r_i$ being generated based on the QC-LDPC code lifted for maximal length $N_{max}$ and maximal circulant size $Z_{upper}$ of the base matrix, wherein $N_{max}=Z_{upper}*L$, L is a column in the base matrix and $0 \le r_i \le Z_{upper}-1$, wherein the processor is configured to:
receive a data packet;
determine a circulant $Z_{current}$ from the plurality of circulants $Z_1, Z_2, \ldots, Z_{upper}$;
select a value $r_{current}$ from the plurality of values $r_i$ stored in the memory corresponding to the circulant $Z_{current}$;
obtain a lifted matrix based on the value $r_{current}$; and
perform QC-LDPC coding on the data packet for error correction based on the lifted matrix, and wherein the lifted matrix is obtained by a floor scale modular lifting of a base matrix of a QC-LDPC code, by the processor, and the floor lifting of the base matrix is calculated as:

$$E(H_{current}) = \left\lfloor \frac{Z_{current}}{Z_{upper}}((E(H_{upper}) * r_{current}) \bmod Z_{upper}) \right\rfloor,$$

where $E(H_{upper})$ is a value of circulant shift in the base matrix for maximal circulant size, $H_{upper}$ is the base matrix for the maximal circulant size, and $0 \le r_{current} \le Z_{upper}-1$ and $r_{current}=1$ is excluded.

7. The apparatus of claim 6, wherein, the plurality of values $r_i$ corresponding to the plurality of circulants $Z_1, Z_2, \ldots, Z_{upper}$ are generated by:

constructing a plurality of families of parity-check matrixes, each family corresponds to value r in a plurality of values $r_1, r_2, \ldots, r_k$ corresponding to code lengths $N_1, N_2, N_3, \ldots, N_k$; and based on the plurality of the families of the parity-check matrixes, selecting the plurality of values $r_i$ corresponding to the plurality of circulants $Z_1, Z_2, \ldots, Z_{upper}$ by multi-parameter filtering.

8. The apparatus of claim 7, wherein the multi-parameter filtering uses a method including at least one of: Extrinsic Message Degree, ACE Spectrum, Tanner Spectral Bound, Code Distance, Codeword's weight spectrum enumerator, Trapping Set Weight Enumerator, and simulations result.

9. The apparatus of claim 7, wherein the processor is further configured to construct the plurality of the families of the parity-check matrixes using equation:

$E_r(H_{upper})=E(H_{upper}) \cdot r \bmod Z_{upper}$, where $E_r(H_{upper})$ is a value of circulant shift in the base matrix for maximal circulant size corresponding to the value r.

* * * * *